United States Patent
Jung et al.

(10) Patent No.: US 11,928,588 B2
(45) Date of Patent: Mar. 12, 2024

(54) IN-MEMORY DEVICE FOR OPERATING MULTI-BIT WEIGHT

(71) Applicant: UIF (University Industry Foundation), Yonsei University, Seoul (KR)

(72) Inventors: Seong Ook Jung, Seoul (KR); Hong Keun Ahn, Seoul (KR); Young Kyu Lee, Seoul (KR)

(73) Assignee: UIF (University Industry Foundation), Yonsei University, Seoul (KR)

( * ) Notice: Subject to any disclaimer, the term of this patent is extended or adjusted under 35 U.S.C. 154(b) by 856 days.

(21) Appl. No.: 16/997,674

(22) Filed: Aug. 19, 2020

(65) Prior Publication Data

US 2021/0390391 A1 Dec. 16, 2021

(30) Foreign Application Priority Data

Jun. 10, 2020 (KR) .................. 10-2020-0070430

(51) Int. Cl.
| | |
|---|---|
| *G06N 3/063* | (2023.01) |
| *G06N 3/04* | (2023.01) |
| *G06N 3/065* | (2023.01) |
| *G06N 3/08* | (2023.01) |
| *G11C 11/412* | (2006.01) |
| *G11C 11/419* | (2006.01) |

(52) U.S. Cl.
CPC .............. *G06N 3/08* (2013.01); *G06N 3/04* (2013.01); *G06N 3/065* (2023.01); *G11C 11/419* (2013.01)

(58) Field of Classification Search
CPC . G06N 3/08; G06N 3/04; G06N 3/065; G11C 11/419; G11C 7/1006; G11C 7/16; G11C 7/1045; G11C 11/54
See application file for complete search history.

(56) References Cited

U.S. PATENT DOCUMENTS

| | | | |
|---|---|---|---|
| 10,643,705 B2* | 5/2020 | Choi ................ | G11C 13/004 |
| 11,289,171 B1* | 3/2022 | Tran ................ | G11C 7/1006 |
| 2017/0337466 A1* | 11/2017 | Bayat ............... | G06N 3/063 |
| 2019/0042199 A1* | 2/2019 | Sumbul ............ | G11C 7/12 |
| 2019/0088310 A1* | 3/2019 | Li .................... | G11C 7/1006 |
| 2020/0301668 A1* | 9/2020 | Li .................... | G11C 11/54 |
| 2021/0124793 A1* | 4/2021 | Wang ............... | G06N 3/063 |

FOREIGN PATENT DOCUMENTS

| | | |
|---|---|---|
| KR | 101802815 B1 | 12/2017 |
| KR | 1020190061854 A | 6/2019 |

* cited by examiner

*Primary Examiner* — Brandon S Cole (57) ABSTRACT

Disclosed is an in-memory device for operation of a multi-bit weight. A multi-bit memory cell array according to an exemplary embodiment of the present invention includes at least one multi-bit unit which stores input data based on an input signal and outputs a per-group sum value summed for every group by applying a multi-bit weight to the stored input data; and a final summation unit which is connected to at least one multi-bit unit, adjusts a ratio for every group to receive the peer-group sum value, and outputs a final output value by summing the input per-group sum value.

9 Claims, 11 Drawing Sheets

| | Conventional | Proposed Hierarchy Method | |
|---|---|---|---|
| Bit-width | 8 | 8 | |
| Summation Step | 1 | 2 | 3 |
| Cap Requirement | 1,2,...,128(=2⁷)C | {1,2,4,8C} x 2 | {1,2C} x 4 |
| Total Cap Requirement | 255C | 30C | 12C |

# IN-MEMORY DEVICE FOR OPERATING MULTI-BIT WEIGHT

CROSS-REFERENCE TO RELATED APPLICATIONS

This application claims priority to and the benefit of Korean Patent Application No. 10-2020-0070430 filed in the Korean Intellectual Property Office on Jun. 10, 2020, the entire contents of which are incorporated herein by reference.

TECHNICAL FIELD

The present invention relates to an in-memory device for operating a multi-bit weight. The research of the present invention relates to 'N2OC: Neural-Network-on-Chip for Real Time Super-Resolution' of an ICT creative project carried out with the support of Samsung Future Technology Promotion Project (No. 2018-11-1438).

BACKGROUND ART

The contents described in this section merely provide background information on the exemplary embodiment of the present disclosure, but do not constitute the related art.

As artificial intelligence processing method such as deep learning requires a large amount of data processing, overhead for a power and delay generated in memory data access and transfer is significant more than overhead for a power and delay generated in the computing. Therefore, in order to reduce the overhead for the power and delay generated in the memory data access and transfer, as illustrated in FIG. 1A, a computing in memory (CIM) technique which is a technique of calculating in a memory is necessary.

FIGS. 1A to 1E are views for explaining an in-memory device of the related art.

Figure 1A:
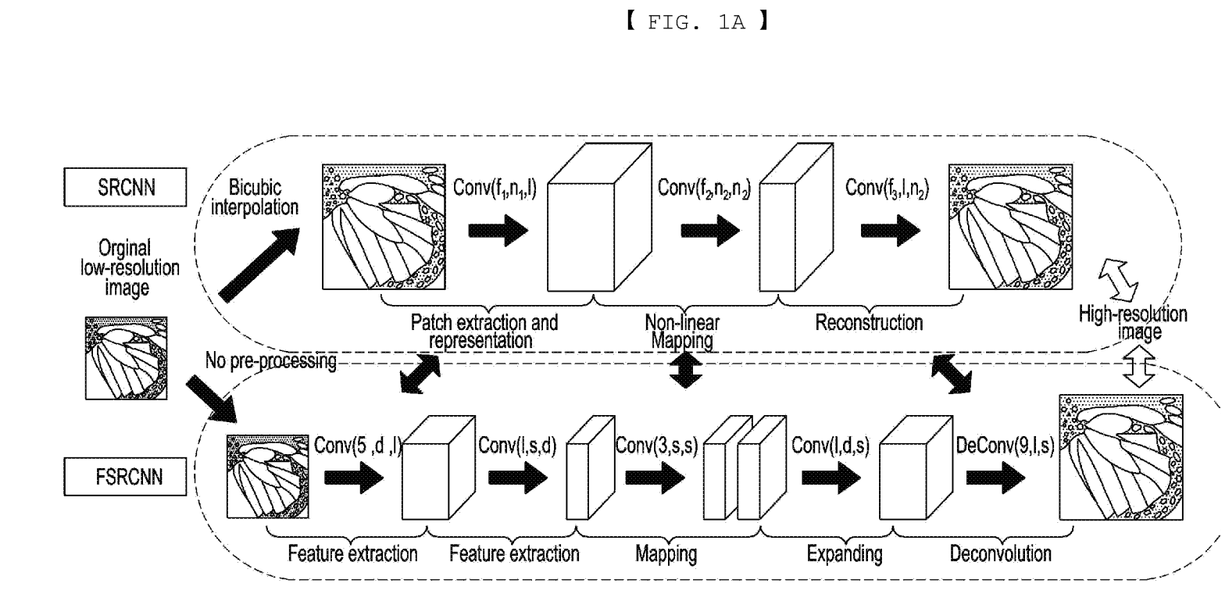
FIGS. 1A to 1E are views for explaining an in-memory device of the related art.

FIG. 1A illustrates a neural network for a super-resolution restoration task. In the field of image processing, the performance is being rapidly developed along with the development of the artificial intelligence neural network. Recently, in order to implement an algorithm in the hardware, a binary network through a technique such as weight compression has been developed.

However, in tasks that place importance on the pixel value itself, such as a super-resolution restoration task, performance decreases rapidly as the bit-width of the algorithm decreases. In order to maintain a peak signal to noise ratio (PSNR) of an algorithm for the task, at least 8-bit weight needs to be used. Therefore, a multi-bit weight operation in the in-memory device is necessarily required.

Figure 1B:
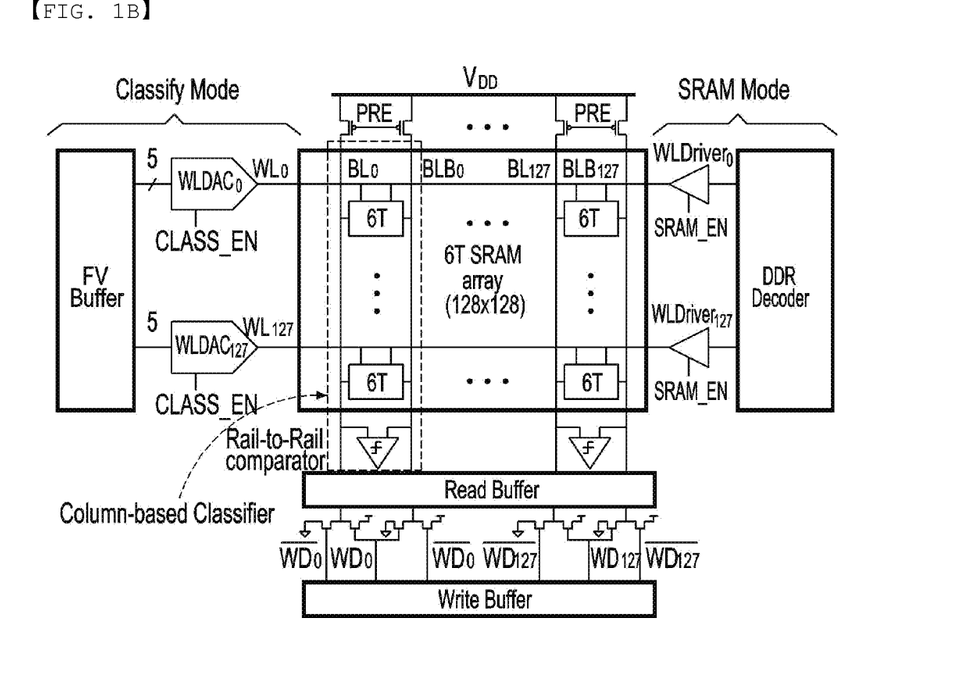
Figure 1C:
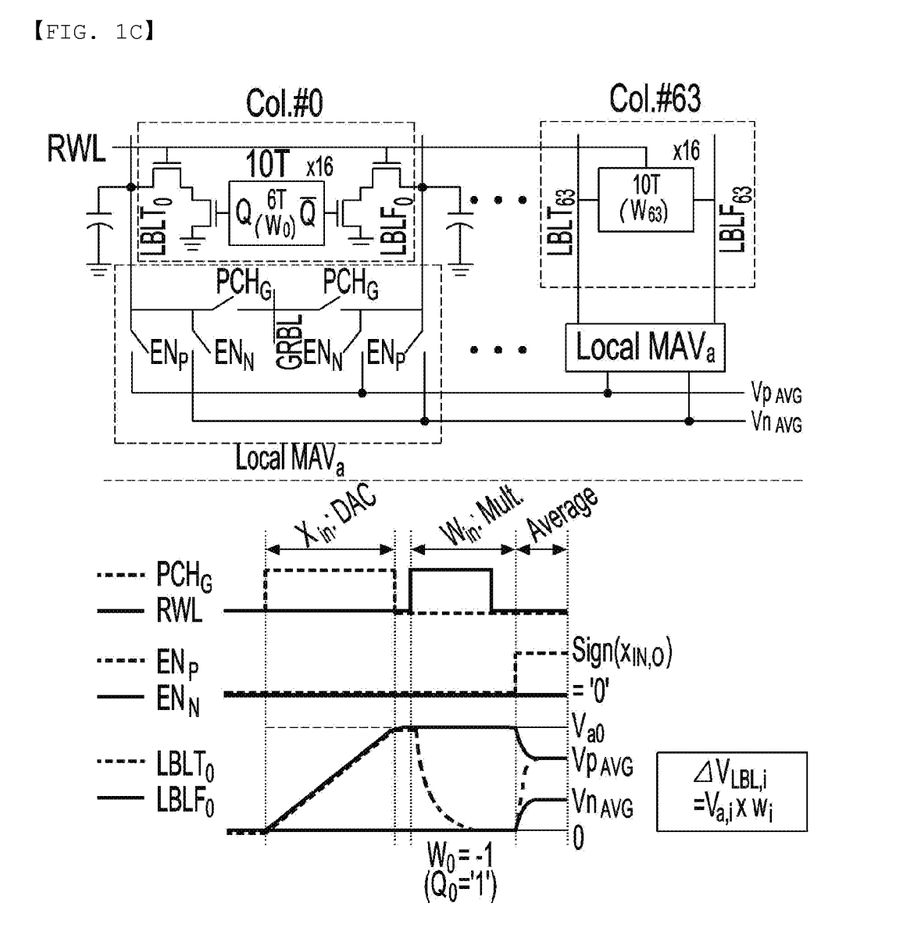

FIG. 1B illustrates an in-memory device of the related art which performs weight summation based on the bit line and FIG. 1C illustrates an in-memory device of the related art which performs weight summation based on the word line. Referring to FIGS. 1B and 1C, the in-memory device of the related art implements a binary neural network using a classification task target. However, the in-memory device of the related art operates by adding the binary weight to a multi-bit input signal and a multi-bit output signal so that the performance is degraded. Therefore, due to the degraded performance, an application operation of a normal super-resolution restoration cannot be performed.

Figure 1D:
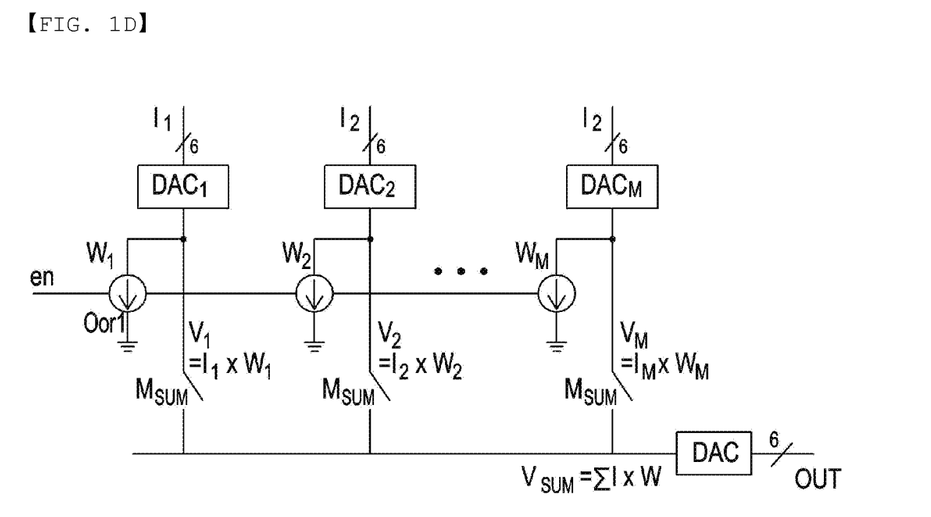
Figure 1E:
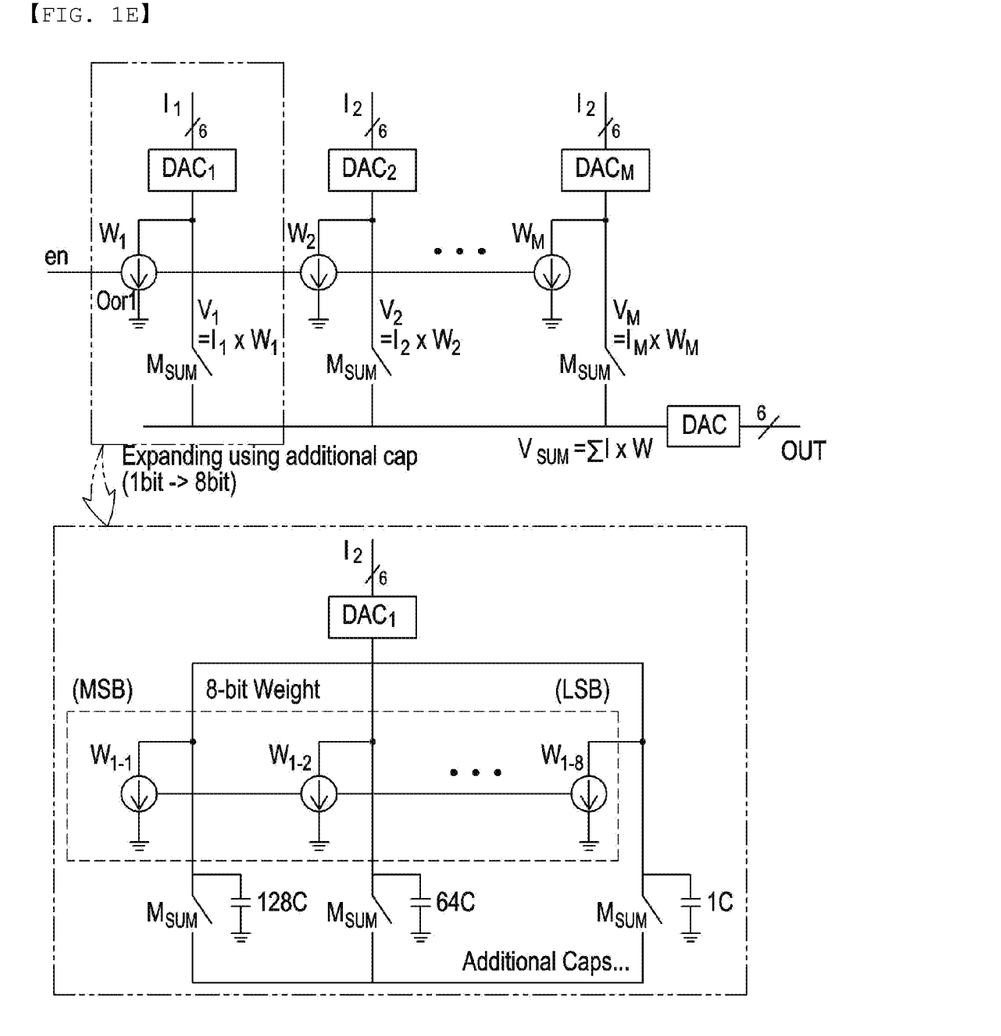

FIGS. 1D and 1E illustrate an in-memory device of the related art which follows a charge sharing method.

FIG. 1D illustrates an in-memory device of the related art which applies a single bit weight. The in-memory device of FIG. 1D operates in a precharge step, a weight multiplication step, and a summation step.

In the precharge step, a digital input signal (6 bit, $I_X$) is converted into an analog voltage $V_X$ to perform the precharge operation. In the weight multiplication step, binary data (weight) corresponding to cell data is applied to the voltage $V_X$ and the voltage $V_X$ to which a weight is applied is discharged. In the summation step, a node through which the voltage $V_X$ is discharged is connected for sharing charges, the summed voltage $V_{SUM}$ is output and the output summed voltage is converted into a digital output signal (6 bit) to be output.

As illustrated in FIG. 1E, the in-memory device of the related art according to the charge sharing method may expand a weight bit-width using an additional capacitor to apply a multi-bit weight. Specifically, in the in-memory device of the related art, in order to apply N multi-bit weights, a device which additionally connects additional capacitors to the nodes to expand array columns by N times to apply a multi-bit weight may be implemented.

However, in the in-memory device of the related art which is capable of applying a multi-bit weight, the number of capacitors which increases by a power of 2 is required so that when a bit weight is increased by one bit, an area is increased by two times per bit. For example, in the case of a device which applies a multi-bit weight of 8 bits, a capacitor having a capacitance of 1 C, 2 C, ... , 128 C is required so that an area overhead may occur.

SUMMARY OF THE INVENTION

A main object of the present invention is to provide an in-memory device which hierarchally performs summation for multi-bit weights.

According to an aspect of the present invention, in order to achieve the above-described object, a multi-bit memory cell array includes: at least one multi-bit unit which stores input data based on the input signal and outputs a per-group sum value summed for every group by applying a multi-bit weight to the stored input data; and a final summation unit which is connected to at least one multi-bit unit, adjusts a ratio for every group to receive the per-group sum value, and outputs a final output value by summing the input per-group sum value.

According to another aspect of the present invention, in order to achieve the above-described object, an in-memory device includes: a plurality of bit lines and a plurality of word lines; a DAC which converts a digital input signal into an analog input voltage; a memory cell array which includes at least one multi-bit memory cell which stores a multi-bit weight and input data based on the input voltage and performs multiplication and summation for every group using the multi-bit weight and the input data to output a final output value; and an ADC which receives the final output value and converts the final output value into a digital output signal. As described above, according to the present invention, the number of capacitors which are additionally required to apply the multi-bit weight may be significantly reduced.

According to the present invention, an area required to apply the multi-bit weight may be reduced.

Further, according to the present invention, as the bit weight of the multi-bit weight to be operated is increased, the number of capacitors and areas may be reduced.

Further, according to the present invention, as the summation step is increased, the reduction efficiency of the capacitors may be increased.

DETAILED DESCRIPTION OF THE EMBODIMENT

Hereinafter, exemplary embodiments of the present invention will be described in detail with reference to the accompanying drawings. If it is considered that the description of related known configuration or function may cloud the gist of the present invention, the description will be omitted. Further, hereinafter, exemplary embodiments of the present invention will be described. However, it should be understood that the technical spirit of the invention is not limited to the specific embodiments, but may be changed or modified in various ways by those skilled in the art. Hereinafter, an in-memory device for operation of a multi-bit weight proposed by the present invention will be described in more detail with reference to the drawings.

In a task such as super resolution restoration task, a pixel value is important. Therefore, in order to maintain an algorithm performance, a hardware of the in-memory device needs to necessarily support a function of applying a multi-bit weight.

According to the structure of the in-memory device of the related art, the weighted summation is performed using a charge sharing method, but only one bit (binary) is supported as a bit-weight of the weight.

In order to apply a multi-bit weight in the in-memory device of the related art, approximately two times of capacitor area is additionally required for one bit increment to operate a multi-bit weight. For example, in the case of a multi-bit weight of 7 bits, the in-memory device requires capacitors with a ratio of 1, 2, . . . , $2^6$ and in the case of a multi-bit weight of 8 bits, the in-memory device requires capacitors with a ratio of 1, 2, . . . , $2^7$. Therefore, the number of capacitors required in accordance with the increased bit number is exponentially increased.

That is, in the in-memory device of the related art, the chip area due to the capacitors is increased, which may become a big problem to implement a hardware for applying a multi-bit weight in the silicon.

The present invention proposes a computation in-memory (CIM) structure which hierarchally performs the summation and also proposes an operation method for minimizing the usage of additional capacitors.

Figure 2:
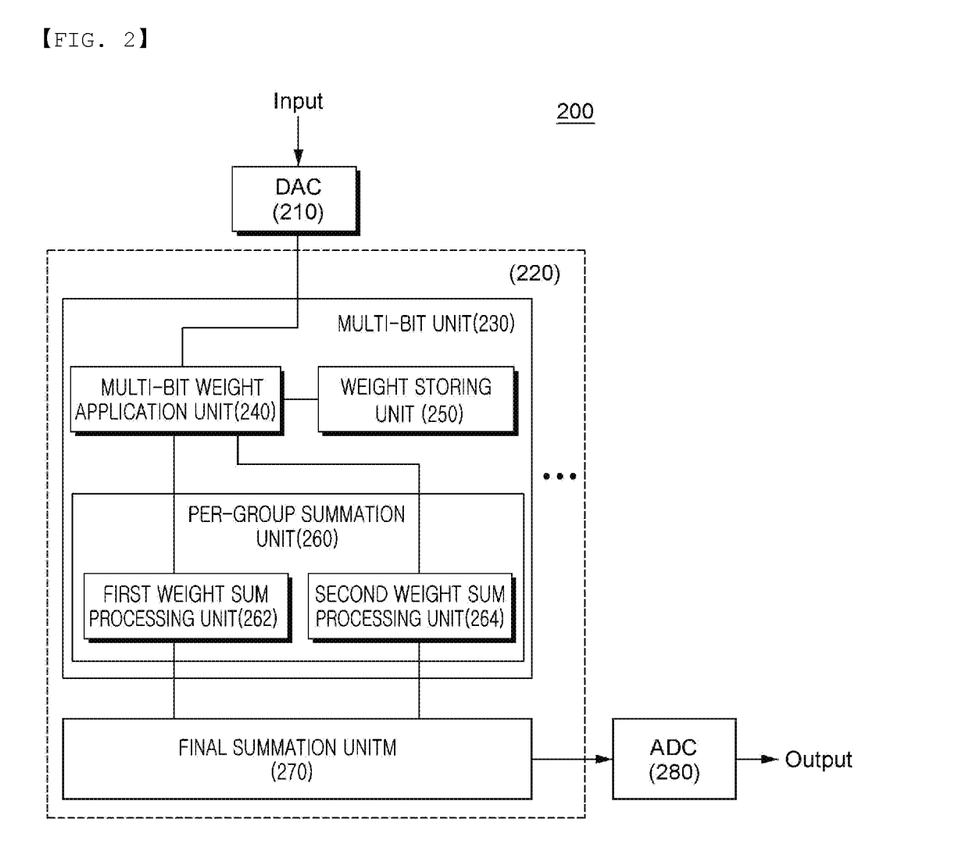
FIG. 2 is a block diagram schematically illustrating an in-memory according to an exemplary embodiment of the present invention.

FIG. 2 is a block diagram schematically illustrating an in-memory according to an exemplary embodiment of the present invention.

The in-memory device 200 according to the present invention includes a plurality of bit lines, a plurality of word lines, a digital analog converter (DAC) 210, a memory cell array 220, and an analog digital converter (ADC) 280. The DAC 210 and the ADC 280 included in the in-memory device 200 has the same configuration as the related art so that the detailed description thereof will be omitted.

The memory cell array 220 according to the present invention includes at least one multi-bit unit 230 and a final summation unit 270.

The in-memory device 200 of FIG. 2 is an example so that all blocks illustrated in FIG. 2 are not essential components and in the other exemplary embodiment, some blocks included in the in-memory device 200 may be added, modified, or omitted.

Even though it is described that the in-memory device 200 according to the exemplary embodiment is a static RAM (SRAM) based computing device and the memory cell array 220 may include an SRAM memory cell, the present invention is not limited thereto. Therefore, the in-memory device 200 may be implemented with various types of volatile memory based configurations.

The memory cell array 220 receives an input voltage from the DAC 210 and stores input data and outputs a final output value summed by applying a multi-bit weight to the stored input data to the ADC 280. Hereinafter, a configuration included in the memory cell array 220 and an operation thereof will be described.

At least one multi-bit unit 230 stores input data based on the input signal and outputs a per-group sum value summed for every group by applying a multi-bit weight to the stored input data. The multi-bit unit 230 according to the exemplary embodiment includes a multi-bit weight application unit 240, a weight storing unit 250, and a per-group summation unit 260.

The multi-bit weight application unit 240 includes a plurality of multi-bit application nodes connected in parallel.

The multi-bit weight application unit 240 applies a bit weight which is one of multi-bit weights to input data stored in a capacitor which is connected to each of the plurality of multi-bit application nodes to output a weight applied value. For example, when the multi-bit weight is "10001011", the multi-bit weight application unit 240 applies bit weights "1", "0", "0", "0", "1", "0", "1", and "1" to the multi-bit application nodes. Here, the multi-bit weight refers to a weight acquired from the weight storing unit 250 by controlling the switching operation of a switch equipped in each of the plurality of multi-bit application nodes and the multi-bit weight is desirably a binary bit (0 or 1).

The multi-bit weight application unit 240 stores input data in the capacitor by means of an input voltage corresponding to an input signal applied to each of the plurality of multi-bit application nodes. Thereafter, when the bit weight is input by a predetermined switching operation, the multi-bit weight application unit 240 applies the bit weight to the input data at each of the multi-bit application nodes to output a weight applied value.

The capacitors connected to the plurality of multi-bit application nodes have different capacitances but some of capacitors have the same capacitance. Therefore, the multi-bit weight application unit 240 applies a bit weight to input data corresponding to the capacitance in each of the plurality of multi-bit application nodes to output a weight applied value. Specifically, the multi-bit weight application unit 240 may output the weight applied value calculated by multiplying a bit weight and input data in each of the plurality of multi-bit application nodes.

For example, to four multi-bit application nodes which apply upper bit weights $W_{1-1}$ to $W_{1-4}$ of 8 bit multi-bit weights, capacitors having different capacitances such as 8 C, 4 C 2 C, and 1 C may be connected, respectively. Further, to four multi-bit application nodes which apply lower bit weights $W_{1-5}$ to $W_{1-8}$ of 8-bit multi-bit weights, capacitors having different capacitances such as 8 C, 4 C 2 C, and 1 C may be connected, respectively.

In the meantime, when the 8-bit multi-bit weights are divided in the units of 2 bits to be summed in the multi-bit weight application unit 240 according to the exemplary embodiment, capacitors having different capacitances such as 2 C and 1 C may be connected to two multi-bit application nodes which apply a first bit weight $W_{1-1}$ to $W_{1-2}$, a second bit weight $W_{1-3}$ to $W_{1-4}$ a third bit weight $W_{1-5}$ to $W_{1-6}$, and a fourth bit weight $W_{1-7}$ to $W_{1-8}$, respectively.

A separate controller (not illustrated) may control the multi-bit weight application unit 240 to acquire input data and apply the multi-bit weight, but the present invention is not necessarily limited thereto.

The weight storing unit 250 is supplied with a power voltage between a first bit line BL and a second bit line BLB and stores a multi-bit weight based on the power voltage. Here, the weight storing unit 250 may be implemented by a data storage circuit included in a normal memory cell.

For example, the data storing circuit may include a first access transistor connected to the first bit line BL and a predetermined word line and a second access transistor connected to the second bit line BLB and a predetermined word line. Further, the data storage circuit may include a cross-coupled inverter which is connected to the first access transistor and the second access transistor, includes a plurality of transistors, and operates to charge or discharge the first bit line or the second bit line.

The weight storing unit 250 stores the multi-bit weight and supplies the multi-bit weight to the multi-bit weight application unit 240 in accordance with the switching control. For example, when the weight storing unit 250 stores a multi-bit weight which is "10001011", the weight storing unit 250 supplies the multi-bit weight "10001011" to the multi-bit weight application unit 240. Here, the weight storing unit 250 may supply the bit weights "1", "0", "0", "0", "1", "0", "1", and "1" to the plurality of multi-bit application nodes included in the multi-bit weight application unit 240.

The storing function and the output control function of the weight storing unit 250 may be controlled by a separate controller (not illustrated), but the present invention is not necessarily limited thereto.

The per-group summation unit 260 interworks with the multi-bit weight application unit 240 to perform an operation of outputting a sum value for every group. Specifically, the per-group summation unit 260 divides the plurality of multi-bit application nodes included in the multi-bit weight application unit 240 into groups and sums weight applied values output from the plurality of multi-bit application nodes for every group to output a per-group sum value.

The per-group summation unit 260 includes a first weight sum processing unit 262 and a second weight sum processing unit 264.

The first weight sum processing unit 262 sums a plurality of weight applied values output from the multi-bit application nodes included in a first group among the plurality of multi-bit application nodes to calculate a first group sum value and output the calculated first group sum value.

The first weight sum processing unit 262 includes a multi-bit application node corresponding to higher digits of upper bit weight among the multi-bit weights in a first group to output a first group sum value. For example, the first weight sum processing unit 262 allows a multi-bit application nodes corresponding to the high bit weight which is upper four bits, among 8-bit multi-bit weight, to be included in the first group and sums four weight applied values output from the multi-bit application nodes included in the first group to output a first group sum value.

The second weight sum processing unit 264 sums a plurality of weight applied values output from the multi-bit application nodes included in a second group among the plurality of multi-bit application nodes to calculate a second group sum value and output the calculated second group sum value.

The second weight sum processing unit 264 includes a multi-bit application node corresponding to lower digits of lower bit weight except for the upper bit weight from the multi-bit weights in a second group to output a second group sum value. For example, the second weight sum processing unit 264 allows a multi-bit application nodes corresponding to the lower bit weight which is lower four bits, among 8-bit multi-bit weight, to be included in the second group and sums four weight applied values output from the multi-bit application nodes included in the second group to output the second group sum value.

The multi-bit application node included in the first group in the per-group summation unit 260 may be a multi-bit application node which is different from the multi-bit application node included in the second group.

The per-group summation unit 260 may add or delete a weight sum processing unit (for example, a third weight sum processing unit and a fourth weight sum processing) in accordance with the number of groups in which the plurality of multi-bit application nodes is included.

The final summation unit 270 is connected to at least one multi-bit unit 230 to output a final output value. The final summation unit 270 is connected to at least one multi-bit unit 230 and receives a sum value per group by adjusting a ratio for every group, calculates a final sum value for input sum values for every group, and sums the final sum values to output a final output value.

The final summation unit 270 includes a first final summation line which receives a first group sum value output from at least one multi-bit unit 230 to calculate a first final sum value and a second final summation line which receives a second group sum value output from at least one multi-bit unit to calculate a second final sum value.

The final summation unit 270 adjusts the first group sum value and the second group summation at a specific ratio according to switching operation control of a first final switch connected between at least one multi-bit unit 230 and the first final summation line and a second final switch connected between at least one multi-bit unit 230 and the second final summation line.

For example, when the multi-bit weight application unit 240 divides 8-bit multi-bit weights in the unit of four bits to perform the summation per group, the final summation unit 270 adjusts the first group sum value and the second group sum value at a ratio of 16:1 to calculate the first final sum value and the second final sum value. Further, when the multi-bit weight application unit 240 divides 8-bit multi-bit weights in the unit of two bits to perform the summation per group, the final summation unit 270 adjusts the first group sum value and the second group sum value at a ratio of 4:1 to calculate the first final sum value and the second final sum value.

The final summation unit 270 sums the first final sum value obtained by summing first group sum values and the second final sum value obtained by summing second group values with an adjusted ratio by the switching operation control of a third final switch connected between the first final summation line and the second final summation line to calculate a final output value and outputs the calculated final output value to the ADC 280.

Figure 3:
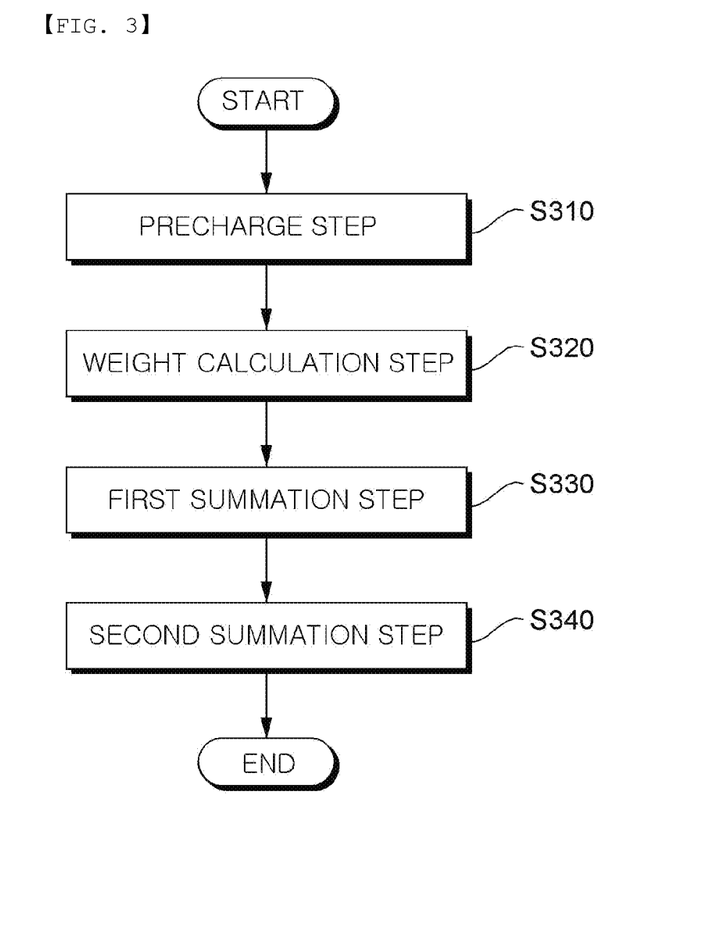
FIG. 3 is a flowchart for explaining an operation step of an in-memory device according to an exemplary embodiment of the present invention.

FIG. 3 is a flowchart for explaining an operation step of an in-memory device according to an exemplary embodiment of the present invention.

The in-memory device 200 receives an input voltage from the DAC based on the input signal to precharge the input data in a capacitor connected to each of the plurality of multi-bit application nodes (precharge step S310).

When a bit weight corresponding to a digit of the multi-bit weight is input by a predetermined switching operation, the in-memory device 200 applies a bit weight to the input data in each multi-bit application node to output the weight applied value (weight calculation step S320).

The in-memory device 200 divides the plurality of multi-bit application nodes into groups and sums the weight applied values output from the plurality of multi-bit application nodes in every group to output a sum value for every group (first summation step S330). Specifically, the in-memory device 200 outputs a first group sum value calculated by summing a plurality of weight applied values output from the multi-bit application nodes included in a first group among the plurality of multi-bit nodes and a second group sum value calculated by summing a plurality of weight applied values output from the multi-bit application nodes included in a second group among the plurality of multi-bit node.

The in-memory device 200 is connected to at least one multi-bit unit and receives a sum value per group by adjusting a ratio for every group, calculates a final sum value for input sum values for every group, and sums the final sum values to output a final output value (second summation step S340).

Even though in FIG. 3, it is described that the steps are sequentially performed, the present invention is not necessarily limited thereto. In other words, the steps illustrated in FIG. 3 may be changed or one or more steps may be performed in parallel so that FIG. 3 is not limited to a time-series order.

The operation method of the in-memory device according to the exemplary embodiment described in FIG. 3 may be implemented by an application (or a program) and may be recorded in a terminal (or computer) readable recording media. The recording medium which has the application (or program) for implementing the operation method of the in-memory device according to the exemplary embodiment recorded therein and is readable by the terminal device (or a computer) includes all kinds of recording devices or media in which computing system readable data is stored.

Hereinafter, in FIGS. 4 to 7, an in-memory device 200 for applying a multi-it weight with a bit width of 8 bits is assumed. The bit width of the multi-bit weight may vary depending on the number of capacitors included in the in-memory device 200 or the number of summation steps.

Figure 4:
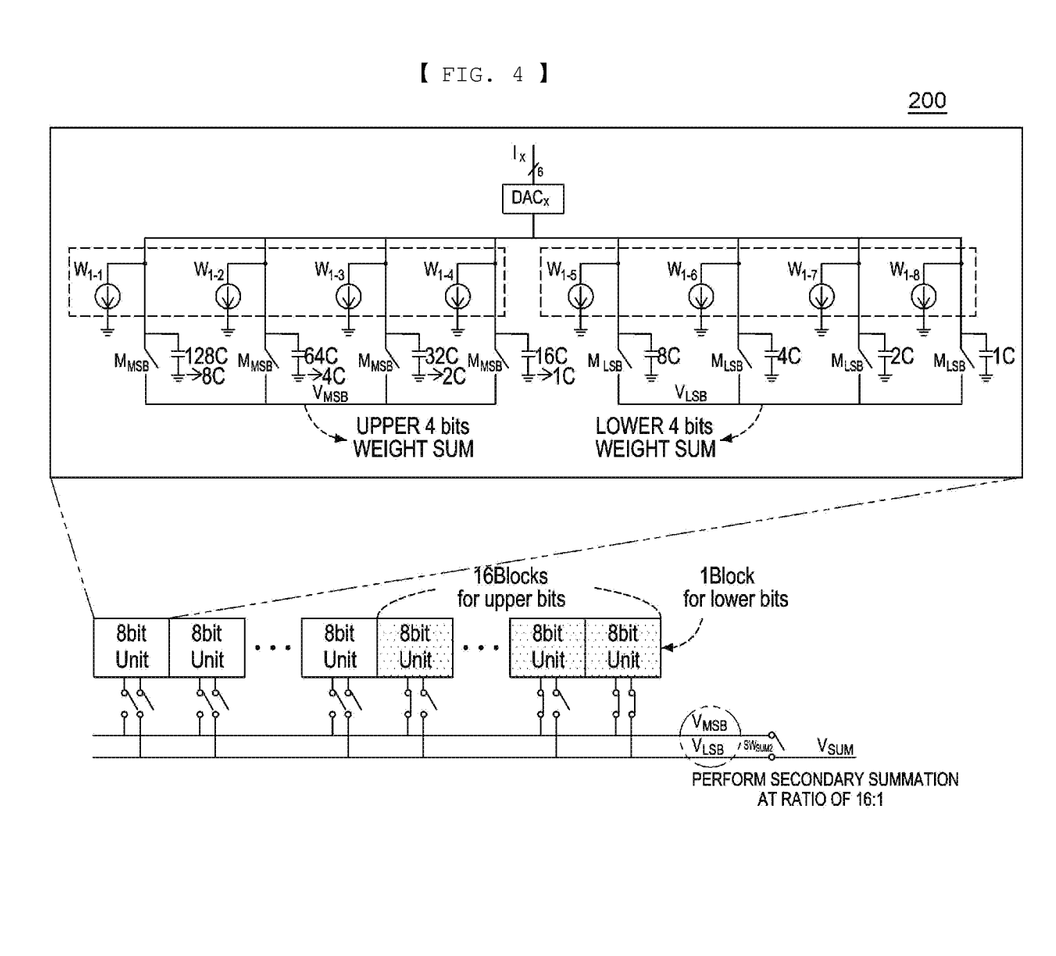
FIG. 4 is a view illustrating a circuit configuration of an in-memory according to an exemplary embodiment of the present invention.

FIG. 4 is a view illustrating a circuit configuration of an in-memory according to an exemplary embodiment of the present invention.

Referring to FIG. 4, in the in-memory device 200 for applying a 8-bit multi-bit weight, capacitors are connected to eight multi-bit application nodes for applying multi-bit weights $W_{1-1}$ to $W_{1-8}$. Here, the capacitors connected to the multi-bit application nodes have different capacitances but some of capacitors have the same capacitance.

To four multi-bit application nodes which apply upper bit weights $W_{1-1}$ to $W_{1-4}$ among 8-bit multi-bit weights, capacitors having different capacitances such as 8 C, 4 C 2 C, and 1 C may be connected, respectively.

Further, to four multi-bit application nodes which apply lower bit weights $W_{1-5}$ to $W_{1-8}$ among 8-bit multi-bit weights, capacitors having different capacitances such as 8 C, 4 C 2 C, and 1 C may be connected, respectively.

In the in-memory device 200 according to the present exemplary embodiment, capacitors such as 8 C, 4 C, 2 C, and 1 C are connected to multi-bit application nodes for applying upper bit weights to $W_{1-4}$, rather than capacitors 128 C, 64 C, 32 C, and 16 C, to apply the multi-bit weight. The capacitor connection described above minimizes a chip area of the in-memory device 200 and minimizes the usage of additional capacitors.

Further, the in-memory device 200 reuses the capacitors 8 C, 4 C, 2 C, and 1 C which have been already connected during the final summation step to output a final output value $V_{SUM}$ to the ADC.

Figure 5:
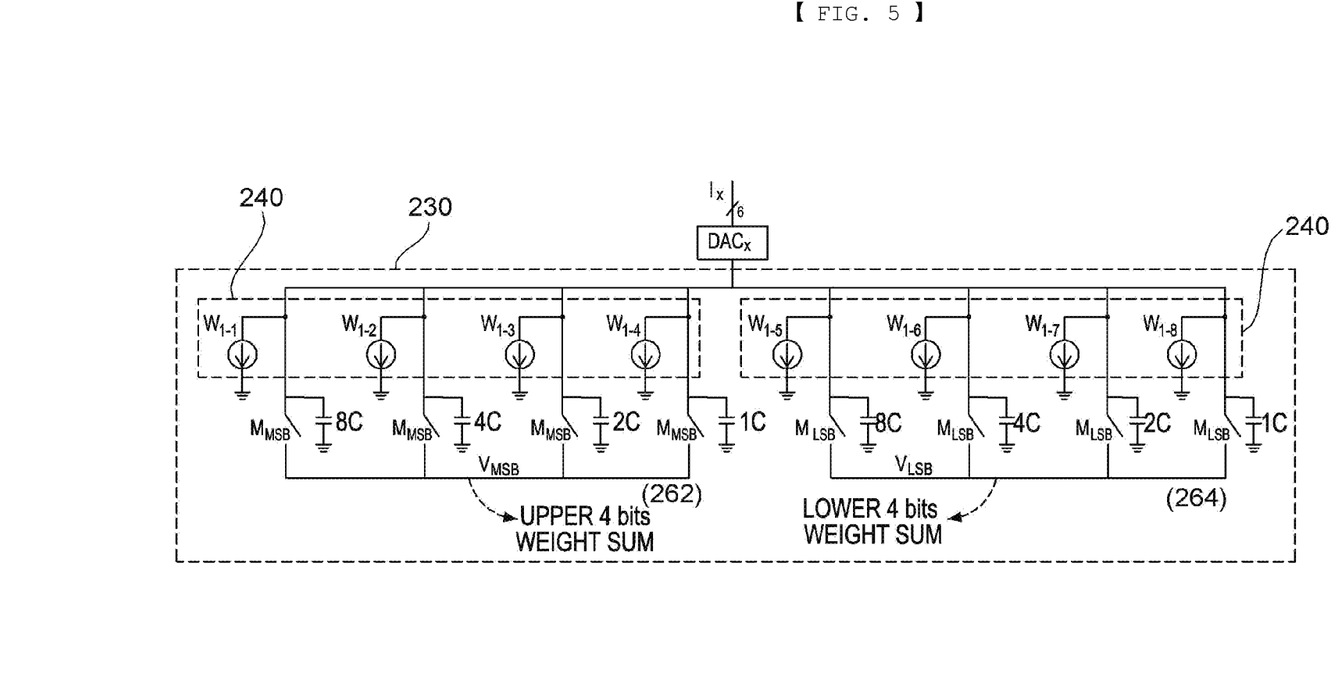
FIG. 5 is a view for explaining a primary summation operation of an in-memory device according to an exemplary embodiment of the present invention.
Figure 6:
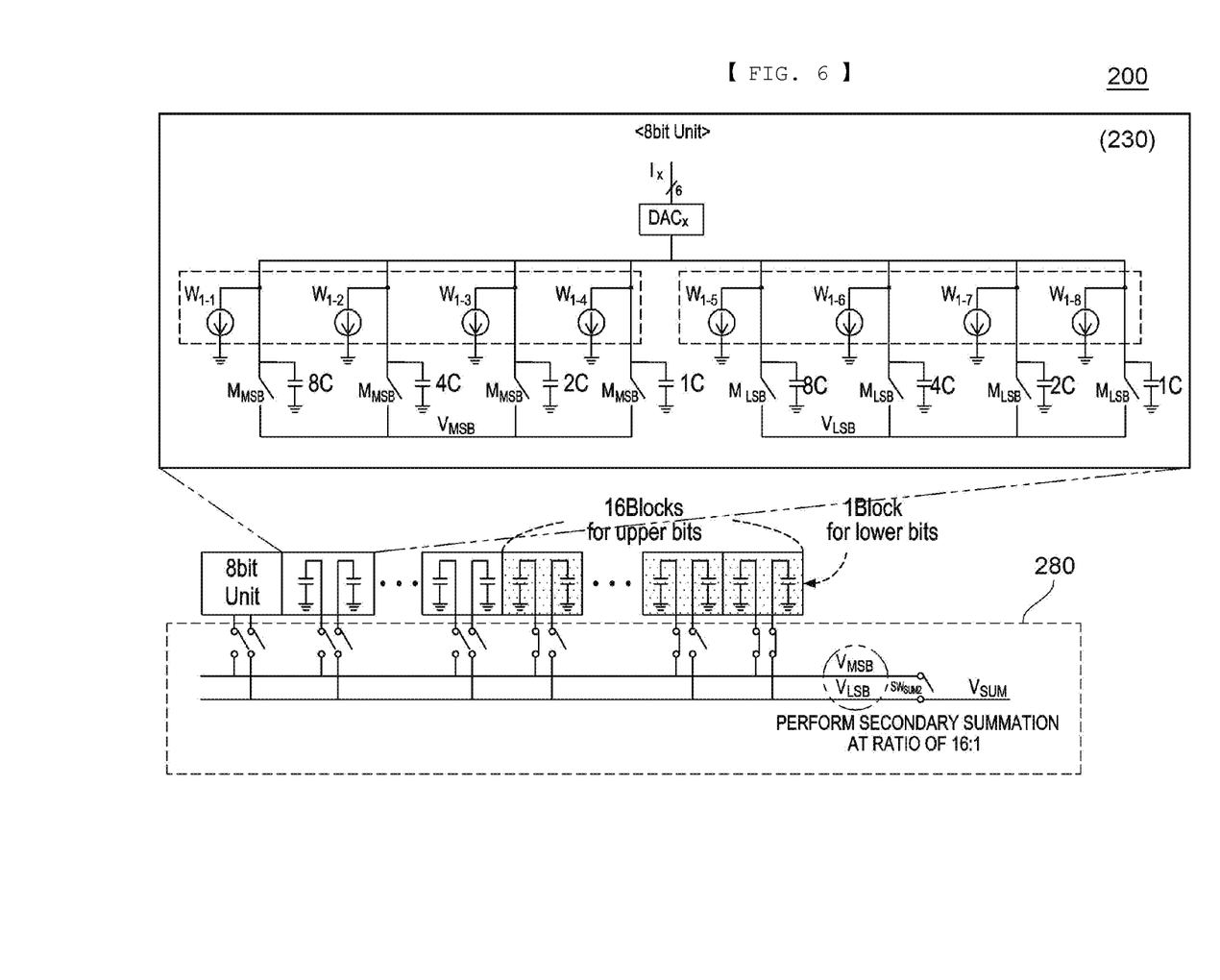
FIG. 6 is a view for explaining a secondary summation operation of an in-memory device according to an exemplary embodiment of the present invention.

FIG. 5 is a view for explaining a primary summation operation of an in-memory device according to an exemplary embodiment of the present invention and FIG. 6 is a view for explaining a secondary summation operation of an in-memory device according to an exemplary embodiment of the present invention.

The in-memory device 200 receives an input signal (6-bit digital code) and converts the input signal into an input voltage Vin in accordance with the input signal in the DAC.

The in-memory device 200 applies the input voltage Vin to each of the plurality of multi-bit application nodes (each node of multi-bit) to charge the capacitors having different capacitances. That is, the capacitors applied to the multi-bit application nodes are charged with different capacitances. Here, the input voltage may be defined as input data.

In the in-memory device 200, the plurality of multi-bit application nodes is connected in parallel and is isolated from each other.

The in-memory device 200 controls the word line to be turned on to turn on a current source and determines an operation of a capacitor in accordance with a supplied current. Here, the current source supplies a current corresponding to each of previously stored multi-bit weights (0 or 1). Further, the supplied current may be a bit weight corresponding to digits of the multi-bit weights and may have a value of 0 or 1.

When a current supplied from the current source to any of the plurality of multi-bit application nodes is 1, a capacitor of the corresponding multi-bit application node is discharged. In contrast, when a current supplied from the current source to any of the plurality of multi-bit application nodes is 0, a capacitor of the corresponding multi-bit application node may perform an operation for maintaining a current state (charged state).

Thereafter, the in-memory device 200 controls the word line to be turned off to turn off the current source.

The capacitors of the plurality of multi-bit application nodes are connected to first charge sharing nodes. Here, the first charge sharing nodes correspond to a per-group summation unit 260.

The in-memory device 200 outputs a first group sum value $V_{MSB}$ for upper 4-bit weight sum by performing first weight summation by charge sharing for upper bit weight groups and outputs a second group sum value $V_{LSB}$ for lower 4-bit weight sum by performing second weight summation by charge sharing for lower bit weight groups.

The in-memory device 200 adjusts and connects switches which are connected to a node connected to a first group sum value $V_{MSB}$ and the second group sum value $V_{LSB}$ of each of the plurality of multi-bit units (8-bit unit) at a predetermined ratio (for example, 16:1).

The in-memory device 200 performs final summation on a first final sum value obtained by summing first group sum values $V_{MSB}$ adjusted by a predetermined ratio and a second final sum value obtained by summing second group sum values $V_{LSB}$ adjusted by a predetermined ratio by additional switching control to output a final output value which is an output voltage $V_{Sum}$ to the ADC.

Figure 7:
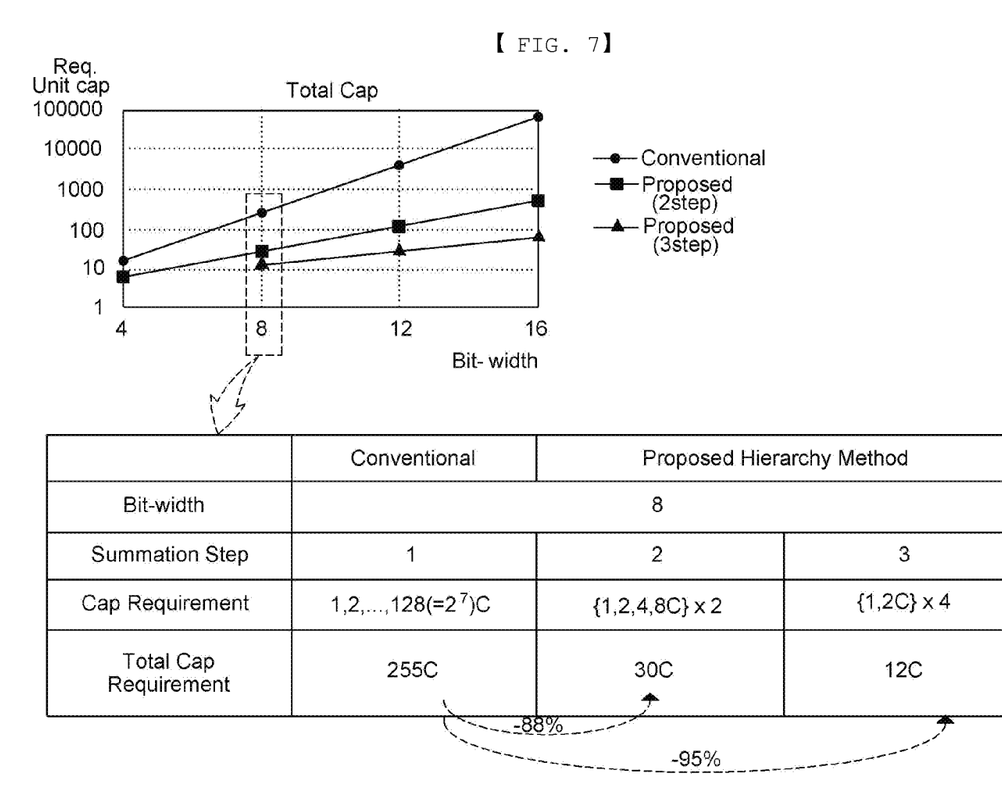
FIG. 7 is a view illustrating an experiment result of an in-memory according to an exemplary embodiment of the present invention.

FIG. 7 is a view illustrating an experiment result of an in-memory according to an exemplary embodiment of the present invention.

When the 8-bit multi-bit weight is applied, the in-memory device of the related art requires capacitors corresponding to 255 C (1, 2, 4, 8, 16, 32, 64, and 128 C) for every multi-bit unit.

In contrast, the in-memory device 200 according to the present invention separates upper 4-bits and lower 4-bits to share the charges so that every multi-bit unit requires capacitors corresponding to 30 C. Therefore, in the in-memory device 200 according to the present invention, as compared with the in-memory device of the related art, the number of capacitors to be added is significantly reduced (approximately, 88%) and an entire chip area is also reduced.

When the steps of summing multi-bit weights is changed to three steps, that is, 8-bit multi-bit weights are divided into four two-bit groups to hierarchally share the charges, in the in-memory device 200 according to the present invention, the number of capacitors to be added may be further reduced (approximately 95%).

It will be appreciated that various exemplary embodiments of the present disclosure have been described herein for purposes of illustration, and that various modifications and changes may be made by those skilled in the art without departing from the scope and spirit of the present invention. Accordingly, the exemplary embodiments of the present disclosure are not intended to limit but describe the technical spirit of the present invention and the scope of the technical spirit of the present invention is not restricted by the exemplary embodiments. The protective scope of the exemplary embodiment of the present disclosure should be construed based on the following claims, and all the technical concepts in the equivalent scope thereof should be construed as falling within the scope of the exemplary embodiment of the present disclosure.

What is claimed is:

1. A multi-bit memory cell array, comprising:
one or more multi-bit units, each of which stores input data in each of a plurality of multi-bit application nodes based on an input signal, groups the plurality of multi-bit application nodes into a plurality of groups, and outputs a per-group sum value summed for each group by applying a multi-bit weight to the stored input data of each of the multi-bit application nodes; and
a final summation unit which is connected through a switch to the one or more multi-bit units, adjusts a ratio for each group to receive a per-group sum value based on a switching operation of the switch, and outputs a final output value by summing the input per-group sum value,
wherein each of the one or more multi-bit units includes:
a weight storing unit which is supplied with a power voltage between a first bit line and a second bit line and stores multi-bit weights based on the power voltage;
a multi-bit weight application unit which includes the plurality of multi-bit application nodes connected in parallel and applies one bit weight among the multi-bit weights to the input data stored in a capacitor connected to each of the plurality of multi-bit application nodes to output a weight applied value; and
a per-group summation unit which groups the plurality of multi-bit application nodes into the plurality of groups to sum the weight applied value for each group to output a sum value for each group.

2. The multi-bit cell array according to claim 1, wherein the multi-bit weight application unit stores the input data in the capacitor through an input voltage corresponding to the input signal applied to the plurality of multi-bit application nodes and when the bit weight is input by a predetermined switching operation, applies the bit weighted value to the input data in each multi-bit application node to output the weight applied value.

3. The multi-bit cell array according to claim 2, wherein the capacitors connected to the plurality of multi-bit application nodes have different capacitances or only some of the capacitors have the same capacitance and the multi-bit weight application unit applies the bit weight to the input data corresponding to the capacitance in each of the plurality of multi-bit application nodes to output the weight applied value.

4. The multi-bit cell array according to claim 3, wherein the multi-bit weight application unit outputs the weight applied value calculated by multiplying the bit weighted value and the input data in each of the plurality of multi-bit application nodes.

5. The multi-bit cell array according to claim 3, wherein the per-group summation unit includes:
a first weight sum processing unit which outputs a first group sum value calculated by summing a plurality of weight applied values output from the multi-bit application nodes included in a first group among the plurality of multi-bit application nodes; and
a second weight sum processing unit which outputs a first group sum value calculated by summing a plurality of weight applied values output from the multi-bit application nodes included in a second group among the plurality of multi-bit application nodes; and
the multi-bit application nodes included in the first group are different from the multi-bit application nodes included in the second group.

6. The multi-bit cell array according to claim 5, wherein the per-group summation unit allows a multi-bit application node corresponding to upper bit weight of upper digits among the multi-bit weight to be included in the first group to output the first group sum value and allows a multi-bit application node corresponding to a lower bit weight of lower digits excluding the upper bit weight from the multi-bit weights to be included in the second group to output the second group sum value.

7. The multi-bit cell array according to claim 6, wherein the final summation unit includes:
- a first final summation line which receives the first group sum value output from the at least one multi-bit unit to calculate a first final sum value; and
- a second final summation line which receives the second group sum value output from the at least one multi-bit unit to calculate a second final sum value,
- the final summation unit adjusts the first group sum value and the second group sum value at a specific ratio according to a switching operation of a first final switch connected between at least one multi-bit unit and the first final summation line and a second final switch connected between at least one multi-bit unit and the second final summation line, and sums the first final sum value and the second final sum value by a switching operation of a third final switch connected between the first final summation line and the second final summation line to output the final output value.

8. An in-memory device, comprising:
- a plurality of bit lines and a plurality of word lines;
- a DAC which converts a digital input signal into an analog input voltage;
- a memory cell array which includes at least one multi-bit memory cell which stores a multi-bit weight and input data based on an input voltage and performs multiplication and summation for each group using the multi-bit weight and the input data to output a final output value; and
- an ADC which receives the final output value and converts the final output value into a digital output signal,
- wherein the memory cell array includes:
  - one or more multi-bit units, each of which stores input data in each of a plurality of multi-bit application nodes based on the input signal, groups the plurality of multi-bit application nodes into a plurality of groups, and outputs a per-group sum value summed for each group by applying a multi-bit weight to the stored input data of each of the plurality of multi-bit application nodes; and
  - a final summation unit which is connected through a switch to the one or more multi-bit units, adjusts a ratio for each group to receive the per-group sum value based on a switching operation of the switch, and outputs a final output value by summing the input per-group sum value,
- wherein each of the one or more multi-bit units includes:
  - a weight storing unit which is supplied with a power voltage between a first bit line and a second bit line and stores multi-bit weights based on the power voltage;
  - a multi-bit weight application unit which includes the plurality of multi-bit application nodes connected in parallel and applies one bit weight among the multi-bit weights to the input data stored in a capacitor connected to each of the plurality of multi-bit application nodes to output a weight applied value; and
  - a per-group summation unit which divides the plurality of multi-bit application nodes into the plurality of groups to sum the weight applied value for each group to output a per-group sum value.

9. The in-memory device according to claim 8, wherein the multi-bit weight application unit stores the input data in the capacitor through an input voltage corresponding to the input signal applied to the plurality of multi-bit application nodes and when the bit weight is input by a predetermined switching operation, applies the bit weighted value to the input data in each multi-bit application node to output the weight applied value, and the capacitors connected to the plurality of multi-bit application nodes have different capacitances or only some of the capacitors have the same capacitance and the multi-bit weight application unit applies the bit weight to the input data corresponding to the capacitance in each of the plurality of multi-bit application nodes to output the weight applied value.

\* \* \* \* \*